United States Patent
Allibert et al.

(10) Patent No.: US 8,008,929 B2
(45) Date of Patent: Aug. 30, 2011

(54) METHOD AND APPARATUS FOR MEASURING A LIFETIME OF CHARGE CARRIERS

(75) Inventors: Frederic Allibert, Grenoble (FR); Oleg Kononchuk, Grenoble (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 106 days.

(21) Appl. No.: 12/670,080

(22) PCT Filed: Sep. 8, 2008

(86) PCT No.: PCT/EP2008/007340
§ 371 (c)(1),
(2), (4) Date: Jan. 21, 2010

(87) PCT Pub. No.: WO2009/033629
PCT Pub. Date: Mar. 19, 2009

(65) Prior Publication Data
US 2010/0188094 A1    Jul. 29, 2010

(30) Foreign Application Priority Data
Sep. 11, 2007    (EP) ..................... 07291091

(51) Int. Cl.
*G01R 27/32*    (2006.01)
(52) U.S. Cl. ........ 324/642; 324/637; 324/501; 250/585; 250/339.06
(58) Field of Classification Search .................... 250/365
See application file for complete search history.

(56) References Cited

U.S. PATENT DOCUMENTS

| | | | |
|---|---|---|---|
| 4,218,143 A * | 8/1980 | Bottka | 356/445 |
| 4,809,196 A | 2/1989 | Miller | 364/550.01 |
| 5,047,713 A * | 9/1991 | Kirino et al. | 324/750.03 |
| 5,406,214 A * | 4/1995 | Boda et al. | 324/750.14 |
| 5,430,386 A * | 7/1995 | Morin et al. | 324/754.23 |
| 5,760,597 A * | 6/1998 | Yoshida et al. | 324/754.23 |
| 2002/0158642 A1 | 10/2002 | Pavelka | 324/750 |

FOREIGN PATENT DOCUMENTS

| EP | 0 240 668 | 10/1987 |
|---|---|---|
| WO | WO 01/61745 | 8/2001 |

OTHER PUBLICATIONS

International Search Report, PCT/EP2008/007340, mailed Oct. 20, 2008.
Rehwald, W. et al., "An Instrument for Contactless Lifetime Measurements in Semiconductor Layers of Silicon-on-Insulator (SOI) Materials", Semiconductor Science and Technology, vol. 6, pp. 735-742, (1991).

* cited by examiner

*Primary Examiner* — Huy Q Phan
*Assistant Examiner* — Richard Isla Rodas
(74) *Attorney, Agent, or Firm* — Winston & Strawn LLP

(57) ABSTRACT

An apparatus for measuring a lifetime of charge carriers that has a measuring probe and a component for directing ultraviolet radiation to a measuring position. The measuring probe also includes at least one electrode provided at a predetermined spatial relationship to the measuring position. A microwave source is adapted to direct microwave radiation to the measuring position, a microwave detector is adapted to measure an alteration of an intensity of microwave radiation reflected at the measuring position in response to the ultraviolet radiation and a semiconductor structure holder is adapted to receive a semiconductor structure and to provide an electric contact to a portion of the semiconductor structure. Additionally, a device for moving the substrate holder relative to the measuring probe is provided for positioning at least one portion of the semiconductor structure at the measuring position. The apparatus includes a power source adapted to apply a bias voltage between the semiconductor structure holder and the electrode.

23 Claims, 5 Drawing Sheets

METHOD AND APPARATUS FOR MEASURING A LIFETIME OF CHARGE CARRIERS

This application is a 371 filing of International Patent Application PCT/EP2008/007340 filed Sep. 8, 2008.

BACKGROUND

The present invention is generally directed to a method and an apparatus for measuring a lifetime of charge carriers in a semiconductor structure.

Integrated circuits comprise a large number of individual circuit elements such as e.g., transistors, capacitors and resistors. These circuit elements are connected by means of electrically conductive features to form complex circuits such as memory devices, logic devices, and microprocessors. In modern integrated circuits, the circuit elements may be formed on and in a so-called semiconductor on insulator structure. A semiconductor on insulator structure comprises a layer of a semiconductor material, for example a layer of silicon, which is formed over a layer of an insulating material provided over a substrate. The insulating material may, for example, comprise silicon dioxide and the substrate may comprise a silicon wafer. Properties of the circuit elements may be sensitive to characteristics of the layer of semiconductor material. In particular, the properties of the circuit elements may be influenced by the recombination lifetime of charge carriers (electrons and holes) in the layer of semiconductor material. Therefore, it may be desirable to measure the recombination lifetime of electrons and/or holes in the layer of semiconductor material.

In a method of measuring a recombination lifetime of charge carriers according to the state of the art, a semiconductor wafer is irradiated with microwave radiation. The reflectance of the wafer for the microwave radiation which is related to the concentration of charge carriers in the wafer, is monitored by measuring an intensity of the reflected microwave radiation. A laser pulse is applied to the wafer to generate electron-hole pairs in the wafer. Due to the generation of the electron-hole pairs, the concentration of charge carriers, in particular the concentration of minority carriers, is increased. Hence, excess minority carriers are created in the wafer. The generation of the excess minority carriers leads to an increase of the reflectivity of the wafer for the microwave radiation.

Thereafter, the excess minority carriers can recombine with majority carriers, which leads to a decay of the reflectivity of the wafer for the microwave radiation. A time constant of the decay, which may be related to the lifetime of the excess minority carriers, may be determined.

In one example of a method of determining a lifetime of charge carriers according to the state of the art, an exponential function $$R(t)=A+B\exp(-t/\tau_1)$$

may be fitted to measurement data obtained during a period of time during which the reflectivity decays approximately exponentially, wherein t denotes the time which has passed since the laser pulse and A, B and $\tau_1$ are parameters which are adapted such that R(t) represents the measured reflectivity values obtained during the period of time as close as possible. The parameter $\tau_1$ is denoted as "primary mode lifetime" and may provide a measure for the lifetime of the excess minority carriers.

In another example of a method of determining a lifetime of charge carriers according to the state of the art, the time during which a difference signal representative of the difference between the measured reflectivity and the reflectivity determined before applying the laser pulse decays by 1/e is determined, wherein e is Euler's number which is well known to persons skilled in the art. If $V_0$ is the maximum of the difference signal, the time $\tau_e$ during which the difference signal decays from $V_0$ to $V_0/e$ is measured. The time $\tau_e$ is denoted as "1/e lifetime" and may provide a measure for the lifetime of the excess minority carriers.

The lifetime of the excess minority carriers may be influenced both by a recombination of charge carriers on recombination centers in the volume of the wafer and by a recombination of charge carriers at the surface of the wafer. The recombination of charge carriers in the volume may be characterized by a volume recombination lifetime, whereas the recombination of charge carriers at the surface may be characterized by a surface recombination lifetime.

The volume recombination lifetime is defined as the lifetime of excess charge carriers which would be obtained if recombination would occur only at recombination centers in the volume of the wafer. It is a quantity characterizing properties of the wafer material and may be substantially independent of the geometry of the wafer. The surface recombination lifetime is defined as the lifetime of charge carriers which would be obtained if recombination would occur only at the surface of the wafer. It may be influenced by the geometry of the wafer, in particular by the thickness of the wafer, wherein the surface recombination lifetime may increase if the thickness of the wafer is decreased.

If the lifetime of excess minority carriers in a wafer is determined, the measured lifetime may be approximately equal to the surface recombination lifetime, if the recombination of charge carriers occurs preferentially at the surface of the wafer. If, however, the recombination of charge carriers occurs preferentially in the volume of the wafer, the measured lifetime may be approximately equal to the volume recombination lifetime. If the rate of charge carrier recombination on the surface and the rate of charge carrier recombination in the volume are of the same order of magnitude, a measurement of the lifetime of excess minority carrier may reveal a value depending on both the surface recombination lifetime and the volume recombination lifetime.

Hence, a measurement of the volume recombination lifetime may require provisions to increase the surface recombination lifetime such that charge carrier recombination occurs preferentially in the volume of the wafer. Such provisions are conventionally denoted as "passivation of the surface". In examples of methods of determining the volume recombination lifetime according to the state of the art, it may be desirable to obtain a surface recombination lifetime which is greater than ten times the volume recombination lifetime. In the state of the art, it has been proposed to reduce the likelihood of charge carrier recombination at the surface by increasing the thickness of the wafer, by growing a layer of silicon dioxide on the surface of the wafer, by inserting the wafer into diluted fluoric acid before performing the measurement, or by performing the measurement while the wafer is plunged into a iodine solution.

Measuring the lifetime of excess minority carriers in the layer of semiconductor material of a semiconductor on insulator structure may entail specific issues associated therewith, as will be explained in the following.

First, a laser pulse in the ultraviolet range may be used to selectively create excess minority carriers in the layer of semiconductor material.

If a laser pulse having a relatively long wavelength, for example a laser pulse in the near infrared region of the electromagnetic spectrum, is applied to the semiconductor on insulator structure, both the semiconductor layer and the substrate may be irradiated by the laser pulse, since the absorption coefficient of semiconductor materials such as silicon for near infrared light is relatively low such that the laser pulse may penetrate the layer of semiconductor material. Hence, excess minority carriers, which may influence the reflectivity of the semiconductor on insulator structure for microwave radiation, are created both in the substrate and in the layer of semiconductor material.

If a measurement of the lifetime of excess minority carriers in a semiconductor on insulator structure would be performed by means of a laser pulse comprising infrared light, both the excess minority carriers in the layer of semiconductor material and the excess minority carriers in the substrate would contribute to the reflectivity of the semiconductor on insulator structure for the microwave radiation, which would make it difficult to separate the contribution of the layer of semiconductor material from the contribution of the substrate.

Ultraviolet radiation, however, may be absorbed to a relatively large extent in the layer of semiconductor material, such that excess minority carriers may substantially be created only in the layer of semiconductor material. Hence, an influence of the substrate on the results of the measurement may be reduced.

Moreover, charge carriers in the layer of semiconductor material may recombine both at the surface of the layer of semiconductor material and at the interface between the layer of semiconductor material and the substrate. Hence, in order to measure the volume recombination lifetime in the layer of semiconductor material, it may be desirable to passivate the surface of the layer of semiconductor material to reduce the likelihood of charge carrier recombination at the surface, and to make provisions to reduce the likelihood of charge carrier recombination at the interface between the layer of semiconductor material and the layer of insulator material.

In the state of the art, it has been proposed to apply passivation techniques similar to those described above to the surface of the layer of semiconductor material, and to apply a bias voltage between the layer of semiconductor material and the substrate. For this purpose, a ground contact may be provided at the surface of the layer of semiconductor material, and the substrate may be connected to a voltage source.

A polarity of the bias voltage may be such that an accumulation of the majority carriers is created in the layer of semiconductor material at the interface between the layer of semiconductor material and the insulator layer, or such that an inversion is created at the interface, wherein a density of the majority charge carriers at the interface is reduced. If an accumulation is created, the electrical field at the interface may drive the minority charge carriers away from the interface. If an inversion is created, a density of recombination partners for minority carriers at the interface is reduced. Therefore, both an accumulation and an inversion may help to reduce a likelihood of recombination at the interface between the layer of semiconductor material and the insulator layer.

A problem of the method of measuring a lifetime of charge carriers in a semiconductor on insulator structure according to the state of the art is that the electrical field created by the bias voltage may be properly defined only in the vicinity of the ground contact. Hence, while a proper accumulation or inversion may be obtained at the interface between the layer of semiconductor material and the insulator layer in the vicinity of the ground contact, this may not be the case at a distance to the ground contact. Hence, in portions of the semiconductor on insulator structure located at a distance to the ground contact, an undesirably high likelihood of charge carrier recombination at the interface between the layer of semiconductor material and the insulator layer may be obtained.

Another problem of the method of measuring a lifetime of charge carriers in a semiconductor on insulator structure according to the state of the art is that the electrical field applied between the ground contact and the substrate may create a leakage current through the insulator layer. Since a relatively high bias voltage may be required in the method of measuring a lifetime of charge carriers according to the state of the art, a relatively high leakage current may be obtained, and new leakage paths through the insulator layer may even be created. Moreover, leakage may occur at the edges of the semiconductor on insulator structure. The leakage current may adversely affect the measurement of the charge carrier lifetime, since it may provide additional carriers replacing those that have recombined (leading to wrongly overestimated lifetime values) or may remove carriers that have not recombined yet (leading to wrongly underestimated lifetime values).

It is an object of the present invention to provide an apparatus and a method for measuring a lifetime of charge carriers wherein the above-mentioned problems may be avoided or at least reduced.

SUMMARY OF THE INVENTION

An apparatus for measuring a lifetime of charge carriers according to the present invention comprises a measuring probe comprising means for directing ultraviolet radiation to a measuring position. Optionally, the measuring probe further comprises at least one electrode provided at a predetermined spatial relationship to the measuring position. The apparatus further comprises a microwave source adapted to direct microwave radiation to the measuring position, a microwave detector adapted to measure an alteration of an intensity of microwave radiation reflected at the measuring position in response to the ultraviolet radiation and a semiconductor structure holder adapted to receive a semiconductor structure and to provide an electric contact to a portion of the semiconductor structure. Additionally, means for moving the substrate holder relative to the measuring probe for positioning at least one portion of the semiconductor structure at the measuring position are provided. The apparatus further comprises a power source adapted to apply a bias voltage between the semiconductor structure holder and the electrode.

Due to the predetermined spatial relationship between the at least one electrode and the measuring probe, a predetermined electric field distribution may be obtained in the semiconductor structure at the measuring position. Hence, a properly defined bias voltage may be obtained at the measuring position. Since the electrode is a part of the measuring probe, the predetermined spatial relationship is maintained if the measuring probe is moved relative to the semiconductor structure holder to perform measurements at different locations on the semiconductor structure. Thus, measurements at different locations on the semiconductor structure may be performed under well-defined measuring conditions.

Furthermore, the at least one electrode may be provided in the vicinity of the measuring position. Thus, the bias voltage may selectively be applied in the vicinity of the measuring position. The applied electric field is therefore well controlled in the vicinity of the measuring position leading to the control of the accumulation or inversion layer at the interface between the layer of semiconductor material and the insulator layer.

In one embodiment, the at least one electrode comprises one electrode provided adjacent the measuring position.

Thus, the bias voltage may be applied in the vicinity of the measuring position in a convenient manner.

In another embodiment, the at least one electrode comprises a first electrode and a second electrode, wherein the measuring position is located between the first electrode and the second electrode. This electrode arrangement may help to obtain a relatively small component of the electric field in a direction parallel to the surface of the semiconductor structure to be investigated. Thus, currents in the semiconductor structure which might drive charge carriers created at the measuring position away from the measuring position may be reduced. This may help to improve a precision of the measurement.

The at least one electrode may comprise a plurality of first electrodes arranged along a first line and a plurality of second electrodes arranged along a second line, wherein said second line is parallel to said first line and wherein said measuring position is located between the first line and the second line. Alternatively, or additionally, the at least one electrode may comprise a plurality of electrodes circularly surrounding the measuring position. Thus, desirable electric field distributions may be obtained at the measuring position.

The at least one electrode may comprise a needle adapted to puncture the semiconductor structure. Thus, an electrical connection may be provided to a layer of semiconductor material provided in the semiconductor structure even if the layer of semiconductor material is covered by a layer of electrically insulating material which may, for example, be deliberately formed to passivate the surface of the semiconductor structure, or may be formed inadvertently by oxidation of the semiconductor material when the semiconductor structure is exposed to air and/or moisture.

In other embodiments, the at least one electrode may be adapted to provide an electrical connection to an electrically conductive contact structure formed on the semiconductor structure. Thus, an electrical connection to the semiconductor structure for applying the bias voltage may be provided in a manner alternative to touching the semiconductor material by means of the electrode.

The apparatus may further comprise a corona wire and means for applying a voltage between the corona wire and the semiconductor structure holder. Thus, a corona discharge may be created in the vicinity of the corona wire, which may be used to electrically charge a surface of a layer of a dielectric material formed over the semiconductor structure. A layer of a dielectric material having an electrically charged surface may be used to efficiently passivate the surface of the semiconductor structure.

The apparatus may further comprise means for moving the corona wire relative to the semiconductor structure holder. Thus, substantially the entire surface of the layer of dielectric material may be evenly charged in an efficient manner.

In other embodiments, the apparatus may comprise a passivation solution supply adapted to supply a passivation solution to the semiconductor structure. Thus, the surface of the semiconductor structure may be passivated by chemically modifying the surface of the semiconductor structure.

The means for directing ultraviolet radiation to the measuring position may comprise a pulsed ultraviolet laser. Thus, excess minority carriers may be created in the semiconductor structure in an efficient manner by irradiating the semiconductor structure with ultraviolet radiation.

A method of measuring a lifetime of charge carriers according to the present invention comprises providing a semiconductor structure comprising a substrate, a layer of an insulating material formed over said substrate and a layer of a semiconductor material formed over said layer of insulating material. A measurement run is performed. The measurement run comprises irradiating the semiconductor structure with microwave radiation and directing ultraviolet radiation to a portion of the semiconductor structure located at a measuring position. A bias voltage is applied between the substrate and at least one contact point having a predetermined spatial relationship to the measuring position. An alteration of an intensity of microwave radiation reflected from the semiconductor structure in response to the ultraviolet radiation is measured. The method of measuring the lifetime of charge carriers further comprises moving the semiconductor structure relative to the measuring position and repeating the measurement run at least once, wherein the predetermined spatial relationship between the measuring position and the at least one contact point is maintained.

The layer of semiconductor material and the layer of insulating material form a semiconductor on insulator structure, such that the recombination of charge carriers in a semiconductor on insulator structure may be investigated. Since the predetermined spatial relationship between the measuring position and the contact point is maintained in the at least two measurement runs, a predetermined electric field distribution may be obtained in the semiconductor structure in the vicinity of the measuring position during each measurement run. Hence, a properly defined bias voltage may be obtained at the measurement position whenever a measurement is performed. Hence, when the semiconductor structure is moved relative to the measuring position between the measurement runs, measurements at different locations on the semiconductor structure may be performed under well-defined measuring conditions, and the bias voltage may selectively be applied in the vicinity of the measuring position, which may help to reduce the bias voltage required to reduce a recombination of charge carriers at an interface in the semiconductor structure. Thus, leakage currents caused by the bias voltage may advantageously be reduced. The bias voltage may be selected in accordance with the measurement area and the thickness of the layer of insulating material.

Providing the semiconductor structure may comprise passivating a surface of the layer of semiconductor material. The passivation of the surface of the layer of semiconductor material may help to reduce a likelihood of a recombination of charge carriers at the surface of the semiconductor structure.

In one embodiment, the passivation of the surface of the layer of semiconductor material may comprise supplying a passivation solution to the surface of the layer of semiconductor material. The passivation solution may comprise at least one of diluted hydrogen fluoride and a solution of a halogen in a solvent. Applying the passivation solution may modify the chemical structure of the surface of the semiconductor structure such that a likelihood of charge carrier recombination at the surface may be reduced.

In another embodiment, the passivation of the surface of the layer of semiconductor material may comprise forming a layer of a dielectric material over the layer of semiconductor material. The presence of the dielectric material on the surface of the layer of semiconductor material may lead to a reduced likelihood of charge carrier recombination at the surface of the layer of semiconductor material.

The passivation of the surface of the layer of semiconductor material may further comprise applying a corona discharge to a surface of the layer of dielectric material to electrically charge the surface of the layer of dielectric material. Since the layer of dielectric material is electrically insulating, the surface may remain electrically charged for a period of time sufficient to perform one or more measurement runs. The electrically charged surface may create an electrical field in the layer of semiconductor material such that an accumulation of majority charge carriers and/or an inversion is obtained in the vicinity of the surface of the layer of semiconductor material. This may help to reduce the likelihood of charge carrier recombination in the vicinity of the surface of the semiconductor structure.

The application of the corona discharge may be performed before each measurement run. Thus, the measurement runs may be performed under reproducible electric field conditions in the semiconductor structure.

In some embodiments, an annealing may be performed to cure an interface between the layer of semiconductor material and the layer of dielectric material. This may help to reduce the number of recombination centers at the interface.

The provision of the semiconductor structure may further comprise forming a plurality of electrically conductive contact structures over the layer of semiconductor material. In each measurement run, the bias voltage can be applied between the substrate and one of the plurality of contact structures, and the ultraviolet radiation may be directed to a portion of the semiconductor structure having the predetermined spatial relationship to the one of the plurality of contact structures. Thus, the at least one contact point having the predetermined spatial relationship to the measuring position may be provided.

In another embodiment, the application of the bias voltage between the substrate and the at least one contact point may comprise puncturing the semiconductor structure by means of at least one electrode. Hence, the at least one contact point may be electrically connected to the semiconductor structure even in the presence of a thin dielectric layer which may be advertently formed to passivate the surface of the semiconductor structure, or which may inadvertently be formed when the semiconductor structure is exposed to air and/or moisture.

The method of measuring a lifetime of charge carriers according to the present invention may further comprise forming an insulation structure providing electrical insulation between a plurality of portions of the semiconductor structure. In each measurement run, the ultraviolet radiation may be directed to one of the plurality of portions of the semiconductor structure, and the at least one contact point may be provided in the one of the plurality of portions of the semiconductor structure. Thus, the bias voltage may selectively be applied between the one of the plurality of portions of the semiconductor structure and the substrate. This may help to provide a well-defined electric field distribution in the semiconductor structure, and also to avoid adverse effects of leakage currents, specially in the layer of insulating material.

The at least one insulation structure may comprise at least one trench, an oxidized region and a nitrided region. The formation of the insulation structure may comprise at least one of forming at least one of a shallow trench isolation, forming a mesa and performing a local oxidation of the layer of semiconductor material.

BRIEF DESCRIPTION OF THE DRAWINGS

Embodiments of the present invention will now be described with reference to the enclosed figures, wherein.

DETAILED DESCRIPTION OF THE INVENTION

Figure 1:
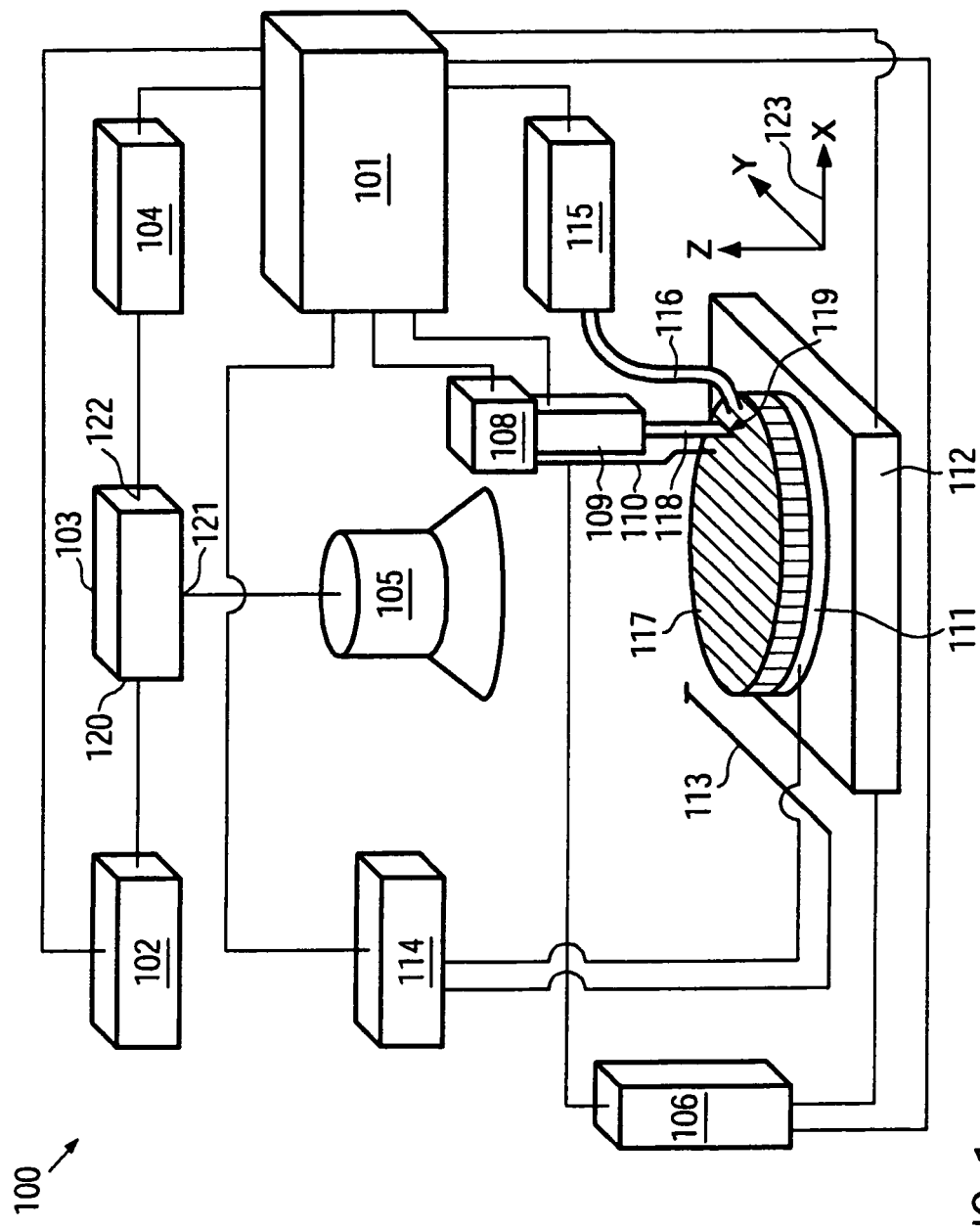
FIG. 1 shows a schematic perspective view of an apparatus for measuring a lifetime of charge carriers according to an embodiment of the present invention.

FIG. 1 shows a schematic perspective view of an apparatus 100 for measuring a lifetime of charge carriers according to an embodiment of the present invention.

The apparatus 100 comprises a measuring probe 108. The measuring probe 108 may comprise a light source 109 adapted to direct electromagnetic radiation 118 to a measurement position 119. In some embodiments, the light source 109 may be adapted to emit light in the ultraviolet range of the electromagnetic spectrum, and/or can be configured to emit light pulses having a relatively short duration. In one embodiment, the light source 109 can comprise a pulsed ultraviolet laser, for example a nitrogen gas laser of a type well known to persons skilled in the art adapted to emit light having a wavelength of about 337 nm. A duration of the pulses emitted by the laser may have a value of about 1 ns.

The measuring probe 108 further comprises an electrode 110 adapted to provide an electrical connection to a contact point on a semiconductor structure 117. The electrode 110 and the light source 109 may be fixed to the measuring probe 108. Thus, a predetermined spatial arrangement between the electrode 110 and the light source 109 as well as the measuring position 119 can be provided.

The present invention is not restricted to embodiments wherein a single electrode 110 is provided. In other embodiments, the semiconductor structure 100 may comprise a plurality of electrodes, wherein each electrode is configured to provide an electrical connection to one of a plurality of contact points on the semiconductor structure 117. The arrangement of the electrode 110 or electrodes relative to the measuring position 119 will be explained in more detail below.

In some embodiments, portions of the light source 109 may be provided at a different location than the measuring probe 108. For example, in one embodiment, the light source 109 may comprise a laser adapted for generating electromagnetic radiation. The laser can be provided at a different location than the measuring probe 108. The light source 109 may further comprise optical components connected to the measuring probe 108 for directing electromagnetic radiation emitted by the laser to the measuring position 119 and means for guiding radiation emitted by the laser to the optical components connected to the measuring probe 108. The means for guiding the radiation emitted by the laser may, for example, comprise one or more optical fibers and/or an arrangement of mirrors, prisms and/or lenses.

The apparatus 100 further comprises a microwave source 102. The microwave source 102 may comprise a microwave sender of a type well known to persons skilled in the art, for example a circuit comprising a Gunn diode. In one embodiment, the microwave source 102 can be adapted to provide a microwave signal having a relatively high frequency, for example a frequency of about 30 GHz. Moreover, the apparatus 100 comprises a microwave detector 104, which may be a microwave receiver of a type well known to persons skilled in the art.

The microwave source 102 and the microwave detector 104 can be connected to a circulator 103. The circulator 103 can be connected to an antenna 105. A circulator is a device well known to persons killed in the art having a first port 120, a second port 121 and a third port 122. The first port 120 is connected to the microwave source 102, the second port 121 is connected to the antenna 105 and the third port 122 is connected to the microwave detector 104. The microwave signal generated by the microwave source 102 which is fed to the first port 120 is transferred to the second port 121. A microwave signal from the antenna 105 which is fed to the second port 121 is transferred to the third port connected to the microwave detector 104. Thus, the antenna 105 may be used both for directing microwave radiation towards the measuring position 119 and for receiving microwave radiation reflected at the measuring position 119.

The present invention is not restricted to embodiments comprising a single antenna 105 and a circulator 103 as shown in FIG. 1. In other embodiments, the apparatus 100 may comprise a first antenna connected to the microwave source 102 for directing microwave radiation towards the measuring position 119, and a second antenna connected to the microwave detector 104 for receiving microwave radiation reflected at the measuring position 119.

The microwave detector 104 can be configured to measure an intensity of microwave radiation reflected at the measuring position 119. In particular, the microwave detector 104 can be adapted to measure an alteration of the intensity of the reflected microwave radiation which is obtained after the measuring position 119 is irradiated with electromagnetic radiation 118 by means of the light source 109, as will be explained in more detail below.

The apparatus 100 further comprises a semiconductor structure holder 111 adapted for receiving the semiconductor structure 117. As will be explained in more detail below, the semiconductor structure 117 can comprise a substrate which may, for example, be provided in form of a semiconductor wafer such as a silicon wafer. In one embodiment, the semiconductor structure holder 111 can comprise a wafer chuck of a type well known to persons skilled in the art. The wafer chuck may comprise an electrically conductive material. Hence, an electrical connection to a portion of the semiconductor structure 117 can be made via the semiconductor structure holder 111. In embodiments wherein the semiconductor structure 117 comprises a substrate comprising a semiconductor wafer, the semiconductor structure holder 111 can be configured to provide an electrical connection to the substrate.

In some embodiments, the semiconductor structure holder 111 may further comprise a thermostat (not shown) adapted to maintain the semiconductor structure 117 at a predetermined temperature. Hence, an influence of temperature fluctuations on the results of measurements performed by means of the apparatus 100 may be reduced.

The apparatus 100 may further comprise means for moving the substrate holder 111 relative to the measurement probe 108. In one embodiment, the means for moving the substrate holder 111 relative to the measurement probe 108 may comprise a translation stage 112 of a type known to persons skilled in the art, wherein the semiconductor structure holder 111 is fixed to the translation stage 112. The translation stage 112 can be adapted to move the semiconductor structure holder in an x-direction and/or a y-direction, as indicated in FIG. 1 by coordinate system 123. The present invention is not restricted to embodiments wherein the substrate holder 111 is mobile. In other embodiments, the semiconductor structure holder 111 can be provided at a fixed location, and the measurement probe 108 can be moved, for example by connecting the measurement probe 108 to a translation stage similar to the translation stage 112.

The measurement probe 108 may, in some embodiments, comprise means for moving the electrode 110 in a direction substantially parallel to a direction of incidence of the electromagnetic radiation 118 at the measuring position 119 which may, in some embodiments, be the z-direction indicated in coordinate system 123. The means for moving the electrode may comprise an actuator of a type known to persons skilled in the art. Thus, the electrode 110 may be brought into contact with the semiconductor structure 117, or may be removed from the semiconductor structure 117 by lowering the electrode 110 down to the semiconductor structure 117 or moving the electrode 110 upward, respectively. In other embodiments, the apparatus 100 may comprise means for moving the semiconductor structure holder 111 in the z-direction, for example an actuator of a type known to persons skilled in the art.

By moving the semiconductor structure holder 111 relative to the measurement probe 108, a portion of the semiconductor structure 117 may be positioned at the measuring position 119 to measure the lifetime of charge carriers in the portion of the semiconductor structure 117. Thereafter, the semiconductor structure holder 111 and the measurement probe 108 may be moved relative to each other again to position another portion of the semiconductor structure 117 at the measurement position 119 for measuring the lifetime of charge carriers in the other portion of the semiconductor structure 117. Thus, spatially resolved measurements of the charge carrier lifetime may be obtained.

The apparatus 100 may further comprise a power source 106. The power source 106 can be connected to the electrode 110 and the semiconductor structure holder 111, and may be adapted to apply a bias voltage between the semiconductor structure holder 111 and, hence, in some embodiments, a substrate of the semiconductor structure 117, and the electrode 110. Thus, an accumulation of majority carriers and/or an inversion may be generated at an interface between material layers provided in the semiconductor structure 117, as will be explained in more detail below.

The apparatus 100 may further comprise means for passivating a surface of the semiconductor structure 117. In some embodiments, the means for passivating the surface of the semiconductor structure 117 may comprise a corona wire 113 and a power source 114 adapted to apply a voltage between the corona wire 113 and the substrate holder 111 and/or a portion of the semiconductor structure 117. The voltage applied by the power source 114 may be adapted to create a corona discharge in the vicinity of the corona wire 113. In such embodiments, the apparatus 100 may comprise means for moving the corona wire 113 relative to the semiconductor structure 117 and/or the substrate holder 111. For example, the translation stage 112 can be configured to move the semiconductor structure holder 111 below the corona wire 113, wherein a distance between the semiconductor structure holder 111 and the corona wire 113 may be adapted such that the corona discharge is applied to the semiconductor structure 117 provided on the semiconductor structure holder 111. Thus, a static electric charge may be created on the surface of the semiconductor structure 117. As will be explained in more detail below, a static electric charge on the surface of the semiconductor structure 117 may help to reduce a likelihood of a recombination of charge carriers at the surface. Thus, a passivation of the surface of the semiconductor structure 117 may be obtained.

In other embodiments, the means for passivating the surface of the semiconductor structure 117 may comprise a passivation solution supply 115 connected to a conduit 116 for applying a passivation solution to the surface of the semiconductor structure 117. The passivation solution may comprise a chemical compound adapted to react chemically with a material on the surface of the semiconductor structure 117. Thus, the chemical structure of the surface of the semiconductor structure 117 may be modified such that a likelihood of a recombination of charge carriers at the surface of the semiconductor structure 117 is reduced. In one embodiment, the passivating solution supply can be adapted to supply diluted fluoric acid to the semiconductor structure 117. In another embodiment, the fluid supply may be configured to supply a solution of a halogen to the semiconductor structure 117, for example a mixture of absolute ($\geqq$99.9%) ethanol and pure ($\geqq$99.8%) iodine with a iodine concentration in a range from about 0.02 mol/l to about 0.2 mol/l.

The passivation solution supply 115 need not be adapted to supply the passivation solution to the semiconductor structure 117 while the semiconductor structure 117 is provided on the semiconductor structure holder 111, as shown in FIG. 1. In other embodiments, the passivation solution may be supplied to the semiconductor structure 117 while the semiconductor structure 117 is provided at another location. Thus, a damaging of components of the apparatus 100 by the chemically reactive passivation solution may advantageously be avoided.

In some embodiments, the corona wire 113 and the power source 114 may be provided in addition to the passivation solution supply 115 and the conduit 116. Hence, different passivation techniques may be performed in conjunction or alternatively by means of the apparatus 100.

The apparatus 100 may further comprise a control unit 101 which may, in some embodiments, comprise a computer 101 of a type well known to persons skilled in the art. The control unit 101 may be connected to the microwave source 102, the microwave detector 104, the power sources 114, 116, the light source 109, the passivation solution supply 115, the measuring probe 108 and the translation table 112. Hence, the apparatus 100 may be operated in a substantially automated manner, and measurement data obtained by means of the apparatus 100 can be processed.

A method of measuring a lifetime of charge carriers according to the present invention will be described with reference to FIGS. 1 and 2.

The semiconductor structure 117 may be provided. The semiconductor structure 117 may comprise a substrate 204. In one embodiment of the present invention, the substrate 204 may comprise a wafer of a semiconductor material, for example a silicon wafer. On the substrate 204, a layer 205 of an insulating material, for example a layer of silicon dioxide, and a layer 206 of a semiconductor material, for example a layer of silicon, can be formed. The layer 206 may, in one embodiment, comprise silicon. In other embodiments, the layer 206 may comprise silicon germanium and/or silicon carbide. As persons skilled in the art know, layers of silicon germanide and/or silicon carbide may be used to provide an intrinsic elastic stress in the semiconductor structure 117, which may help to increase a mobility of electrons and/or holes in the layer 206. As persons skilled in the art know, the substrate 204, the layer 205 of insulating material and the layer 206 of semiconductor material form a semiconductor on insulator structure.

The layer 205 of insulating material and the layer 206 of semiconductor material may be formed by means of semiconductor manufacturing techniques well known to persons skilled in the art like for example using the Smart Cut™ technology. In one embodiment, the layer 205 of insulating material can be formed by oxidizing the substrate 204, for example by means of thermal oxidation well known to persons skilled in the art. Thereafter, an auxiliary wafer comprising the material of the layer 206 may be bonded to the substrate 204 using a known bonding technique such as molecular bonding, and the auxiliary wafer may be cleaved. A portion of the auxiliary wafer remaining on the substrate 204 forms the layer 206 of semiconductor material.

The surface of the layer 206 of semiconductor material may be passivated.

In some embodiments, the surface of the layer 206 can be passivated by exposing the semiconductor structure 117 to a passivation solution adapted react chemically with the material of the layer 206. Thus, the chemical structure of the surface of the layer 206 may be modified such that a likelihood of a recombination of charge carriers at the surface of the layer 206 is reduced. The passivation solution may comprise diluted hydrogen fluoride and/or a solution of a halogen, for example iodine, in a solvent, for example ethanol. In one embodiment, the passivation solution may be supplied to the semiconductor structure 117 by means of the passivation solution supply 115 and the conduit 116 described above with reference to FIG. 1.

In other embodiments, the passivation of the surface of the layer 206 of semiconductor material may comprise forming a layer 207 of a dielectric material over the layer 206 of semiconductor material. In one embodiment, the layer 207 may comprise silicon dioxide, silicon nitride and/or silicon oxynitride. In embodiments wherein the layer 206 comprises silicon, the layer 207 can be formed by means of thermal oxidation and/or nitridation techniques well known to persons skilled in the art. In other embodiments, the layer 207 can be formed by means of well-known deposition techniques such as chemical vapor deposition and/or plasma-enhanced chemical vapor deposition.

Optionally, an annealing may be performed to improve the quality of the interface between the layers 206 and 207, and also leading to a reduction of surface recombination at the interface.

After the formation of the layer 207 of dielectric material, the semiconductor structure 117 may be placed on the substrate holder 111 and a surface of the layer 207 may be electrically charged. For this purpose, the surface of the layer 207 may be exposed to a corona discharge. In some embodiment, the corona discharge can be applied to the surface of the layer 207 by applying a voltage sufficient to induce a corona discharge between the corona wire and the substrate holder 111 and moving the semiconductor structure 117 relative to the corona wire 113, for example by operating the translation stage 112.

Figure 2:
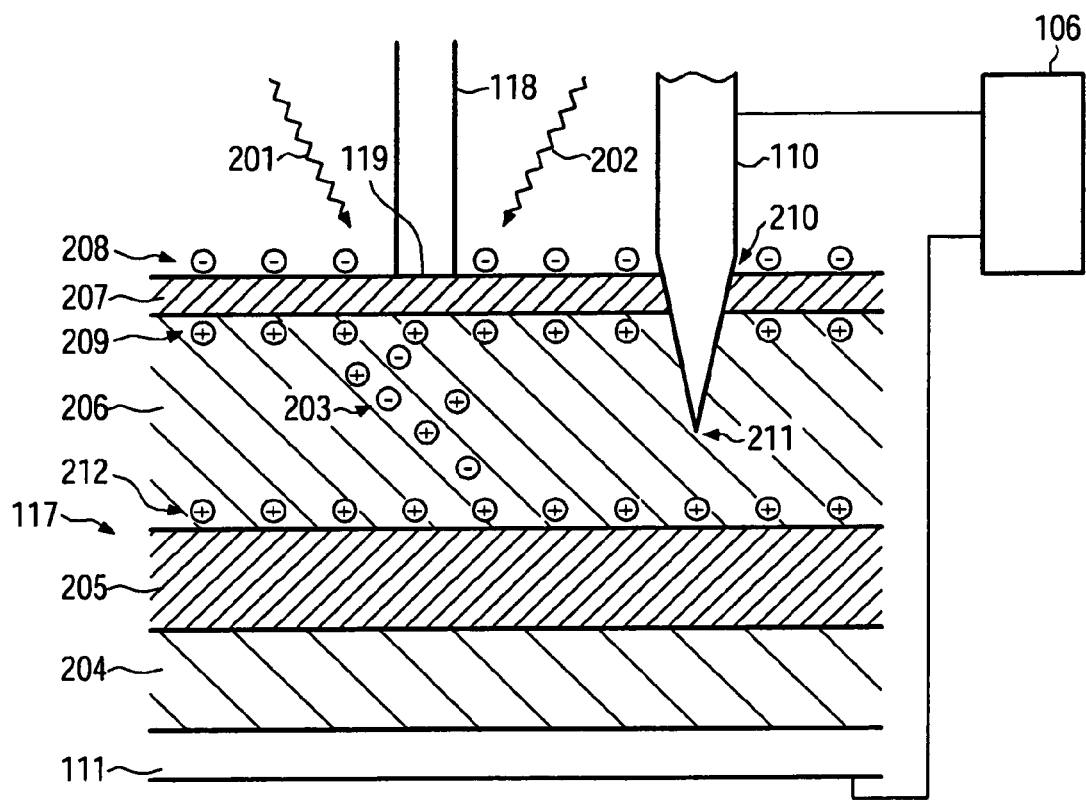
FIG. 2 shows a schematic cross-sectional view of a semiconductor structure in a stage of a method of measuring a lifetime of charge carriers according to an embodiment of the present invention.

When the corona discharge is applied to the surface of the layer 207 of dielectric material, a static electric charge may be created on the surface of the layer 207, as indicated by reference numeral 208 in FIG. 2. A polarity of the static electric charge may be controlled by varying the polarity of the corona wire 113. If the corona wire 113 is a cathode, the charge 208 may be negative, as shown in FIG. 2. If the corona wire 113 is an anode, the charge 208 may be positive. Due to the capacitive effect, the presence of the static electric charge 208 on the surface of the layer 207 of dielectric material may induce a formation of an opposite static electric charge 209 at the interface between the layer 207 of dielectric material and the layer 206 of semiconductor material.

The presence of the static electric charge 209 may induce an accumulation of majority carriers or an inversion at the interface between the layers 206, 207. Thus, likelihood of a recombination of charge carriers at the interface between the layers 206, 207 may be reduced. This may help to increase the surface recombination lifetime of charge carriers at the surface of the semiconductor structure 117.

After the passivation of the surface of the layer 206 of semiconductor material, a measurement run may be performed.

In the measurement run, a bias voltage may be applied between the substrate holder 111 and a contact point 210 in the layer 206 of semiconductor material.

In some embodiments, the contact point 210 may be provided by contacting the layer 206 of semiconductor material by means of the electrode 110. For this purpose, the electrode 110 may comprise a tip 211. Thus, the electrode 110, or at least a portion of the electrode 110, may have the configuration of a needle. The electrode 110 may comprise a relatively hard and electrically conductive material, for example steel, tungsten and/or tungsten carbide. In order to provide the contact point 210, the electrode 110 and the semiconductor structure 117 may be moved towards each other by lowering the electrode 110 down to the semiconductor structure 117 and/or by moving the semiconductor structure 117 upwards towards the electrode 110. Thereby, the tip 211 of the electrode 110 may penetrate the layer 207 of dielectric material and may contact the layer 206 of semiconductor material Thus, the electrode 110 may provide an electrical connection to the layer 206 of semiconductor material at the contact point 210.

After the provision of the contact point 210, a bias voltage may be applied between the substrate holder 111 and the electrode 110 by operating the power source 106. The layer 205 of insulating material may substantially prevent a flow of an electric current between the layer 206 of semiconductor material and the substrate 204. Therefore, an electric charge 212 may be formed at the interface between the layer 206 of semiconductor material and the layer 205 of insulating material. The electric charge 212 is due to an accumulation of majority carriers and/or an inversion at the interface between the layer 206 of semiconductor material and the layer 205 of insulator material. A polarity of the electric charge 212 may be controlled by varying the voltage applied between the semiconductor structure holder 111 and the electrode 110. In some embodiments, the polarity of the electric charge 212 may be the same as the polarity of the electric charge 209.

The microwave source 102 may be operated during the measurement run to irradiate the semiconductor structure 117 with microwave radiation, and an intensity of microwave radiation reflected from the semiconductor structure 117 can be measured by means of the microwave detector 104. In FIG. 2, reference numeral 201 denotes microwave radiation incident on the semiconductor structure 117 and reference numeral 202 denotes microwave radiation reflected from the semiconductor structure 117. In one embodiment, the microwave radiation may have a relatively high frequency of about 30 GHz. A reflectivity of the semiconductor structure 117 for the microwave radiation may be influenced by a concentration of charge carriers in the semiconductor structure 117, in particular by a concentration of minority carriers in the layer 206 of semiconductor material. Hence, the intensity of the reflected microwave radiation may provide a measure for the concentration of minority carriers in the layer 206.

Moreover, electromagnetic radiation 118 may be directed to the measuring position 119 during the measurement run. The electromagnetic radiation may impinge on a portion of the semiconductor structure 117 provided at the measuring position 119. The electromagnetic radiation 118 can be generated by operating the light source 109 of the apparatus 100 described above. In embodiments wherein the light source 109 comprises a pulsed ultraviolet laser, the electromagnetic radiation 118 may be directed to the measuring position 119 by operating the pulsed ultraviolet laser to provide one or more laser pulses.

The irradiation of the semiconductor structure 117 with the electromagnetic radiation 118 may create electron-hole pairs 203 in the vicinity of the measuring position 119. The presence of the electron-hole pairs 203 may increase the density of minority carriers in the vicinity of the measuring position 119. In embodiments of the present invention wherein the electromagnetic radiation 118 comprises ultraviolet radiation, a penetration depth of the electromagnetic radiation 118 in the semiconductor material of the layer 206 may be smaller than a thickness of the layer 206. Therefore, minority carriers may selectively created in the layer 206 of semiconductor material, whereas the density of minority carriers in the substrate 204 may substantially not be affected by the irradiation of the semiconductor structure 117 with the electromagnetic radiation 118.

The alteration of the density of minority carriers in the layer 206 of semiconductor material may lead to an alteration of the reflectivity of the semiconductor structure 117 for the microwave radiation 201. Hence, when the semiconductor structure 117 is irradiated with the electromagnetic radiation 118, an alteration of the intensity of the reflected microwave radiation 202, for example an increase of the intensity of the reflected microwave radiation 202, may be observed.

After the irradiation of the semiconductor structure 117 with the electromagnetic radiation 118, the electron-hole pairs 203 may recombine. Hence, the intensity of the reflected microwave radiation 202 may decrease to the value obtained before the irradiation of the semiconductor structure 117. A duration of the decrease of the intensity of the reflected microwave radiation may be related to the lifetime of the electron-hole pairs in the layer 206 of semiconductor material. Since the surface of the layer 206 was subjected to a passivation process, and the bias voltage is applied between the electrode 110 and the substrate 204, a recombination of the electron-hole pairs at the surface of the layer 206 and at the interface between the layers 206, 205 may substantially be avoided. Hence, the lifetime of the electron-hole pairs 203 may be approximately equal to the volume recombination lifetime. Similar to the method of measuring a charge carrier lifetime according to the state of the art described above, the lifetime of minority carriers formed in the creation of the electron-hole pairs 203 may be determined by fitting an exponential function to the measured intensity of the reflected microwave radiation 202 to determine the primary mode lifetime.

Figure 3A:
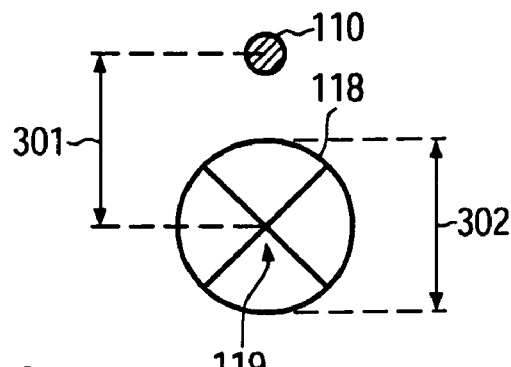
FIGS. 3a to 3c show schematic views of a spatial arrangement of a measuring position and a contact point according to embodiments of the present invention.

After the completion of the measurement run, the semiconductor structure 117 may be moved relative to the measuring probe 108 and the measuring position 119, for example by means of the translation stage 112. Thereafter, another measurement run can be performed. Since the electrode 110 is attached to the measuring probe 108, the spatial relationship between the measuring position 119 and a contact point provided by the electrode 110 in the semiconductor structure 117 may be maintained in the other measuring run. Thus, spatially resolved measurements of the lifetime of charge carriers in the semiconductor structure 117 can be performed. The spatial relationship between the measuring position 119 and the electrode 110 will be explained in more detail with reference to FIG. 3*a*. In FIG. 3*a*, reference numeral 302 denotes a diameter of a beam of electromagnetic radiation 118 impinging at the measuring position 119. The electrode 110 may be provided adjacent the measuring position 119, at a predetermined distance 301 from a center of the measuring position 119. The distance 301 may be greater than one half of the diameter 302 of the beam of electromagnetic radiation 302 such that the electrode 110 is substantially not irradiated by the electromagnetic radiation. Hence, an irradiation of the electrode 110 by the electromagnetic radiation 118 which may lead to an undesirable generation of photoelectrons and/or a shadowing of the electromagnetic radiation 118 may substantially be avoided.

As already mentioned above, the present invention is not restricted to embodiments wherein a single electrode 110 is used to apply the bias voltage. An embodiment of the present invention wherein a plurality of electrodes is provided will be explained in the following with reference to FIG. 3*b*.

Figure 3B:
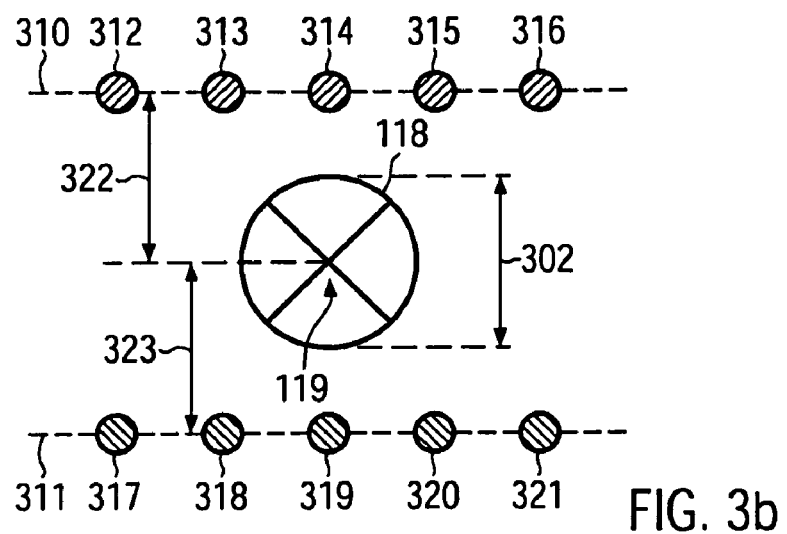

In FIG. 3*b*, reference numerals 312-316 denote a first plurality of electrodes and reference numerals 317-321 denote a second plurality of electrodes. The first plurality of electrodes 312-316 and the second plurality of electrodes 317-321 may be attached to the measuring probe 108 of the apparatus 100 described above with reference to FIG. 1, and each of the first plurality of electrodes 312-216 and the second plurality of electrodes 317-321 may be connected to one pole of the power source 106. The second pole of the power source 106 can be connected to the substrate holder 111, as shown in FIG. 1. Thus, the bias voltage may be applied between each of the electrodes 312-321 and the substrate 204 of the semiconductor structure 117.

The first plurality of electrodes 312-316 may be arranged along a first line 310. The second plurality of electrodes 317-321 may be arranged along a second line 311, wherein first line 310 and the second line 311 are substantially parallel to each other. The measuring position 119 may be provided between the first line 310 and the second line 311. A distance 322 of the first line 310 from a center of the measuring position 119 may be substantially equal to a distance 323 of the second line 311 from the center of the measuring position 119. The distance 322 and the distance 323 may be greater than one half of the diameter 302 of the beam of electromagnetic radiation 118 such than an irradiation of the electrodes 312-321 may substantially be avoided. Advantageously, providing a plurality of electrodes 312-321 may provide a more homogeneous electrical field in the vicinity of the measuring position 119.

A further embodiment of the present invention wherein a plurality of electrodes is provided will be described in the following with reference to FIG. 3*c*.

Figure 3C:
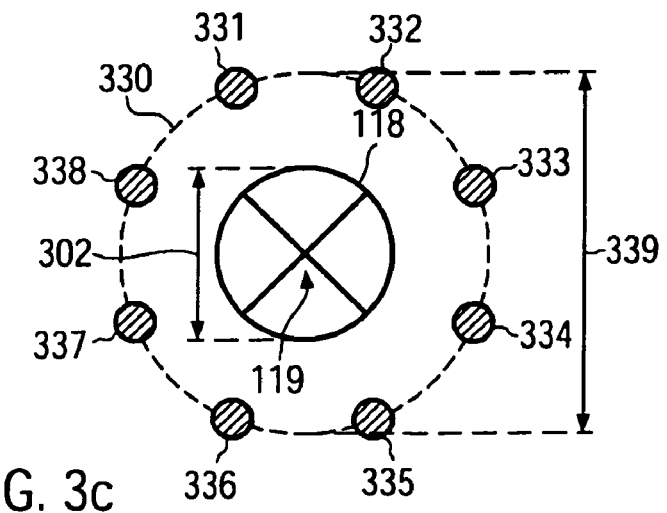

FIG. 3*c* shows a plurality of electrodes 331-338 which are arranged on a circle 330. A center of the circle 330 may be provided at the center of the measuring position 119. Thus, the plurality of electrodes 331-338 circularly surround the measuring position 119. A diameter 339 of the circle 330 may be greater than the diameter 302 of the beam 118 of electromagnetic irradiation. Thus, an irradiation of the electrodes 331-338 may substantially be avoided. Advantageously, a circular arrangement of the electrodes 331-338 may provide a substantially symmetrical electrical field configuration at the measuring position 119.

In a further embodiment, two electrodes may be provided, wherein the measuring position 119 is arranged between the electrodes.

In the embodiments described above with reference to FIGS. 3*a* to 3*c*, each of the electrodes 110, 312-321, 331-338 may comprise a needle adapted to puncture the semiconductor structure 117. Hence, each of the electrodes 110, 312-321, 331-338 may provide an electrical connection to the layer 206 of semiconductor material. Thus, the bias voltage may be applied to a plurality of contact points, the arrangement of which corresponds to the arrangement of the electrodes 110, 312-321, 331-338. Hence, a plurality of contact points having a predetermined relationship to the measuring position 119 may be provided in a convenient manner.

The present invention, however, is not restricted to embodiments wherein contact points are provided on the semiconductor structure 117 by means of one or more electrodes 110, 312-321, 331-338 contacting the layer 206 of semiconductor material.

In other embodiments, contact points may be provided by forming a plurality of electrically conductive contact structures over the layer 206 of semiconductor material, as will be explained in the following with reference to FIGS. 4*a* to 4*c*.

Figure 4A:
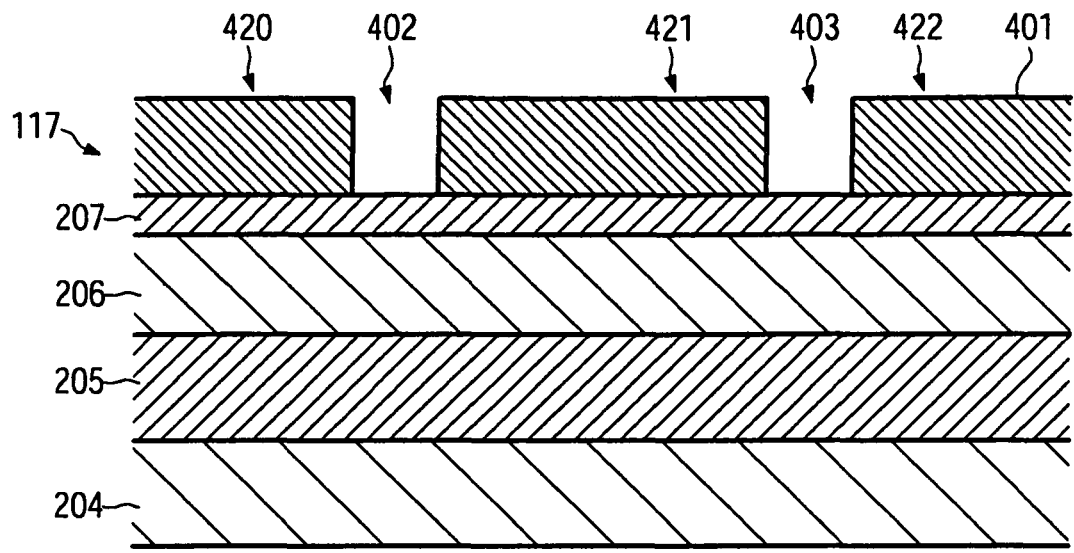
FIGS. 4a to 4c show schematic cross-sectional views of a semiconductor structure in stages of a method of measuring a lifetime of charge carriers according to an embodiment of the present invention.

FIG. 4*a* shows a schematic cross-sectional view of the semiconductor structure 117 in a first stage of a method of measuring a lifetime of charge carriers according to an embodiment of the present invention.

Similar to the embodiment described above with reference to FIG. 2, the semiconductor structure 117 comprises a substrate 204, a layer 205 of an insulating material and a layer 206 of a semiconductor material. Features of the substrate 204 and the layers 204, 205, 206 and the formation of the layers 205, 206 may correspond to those described above with reference to FIG. 2. On the layer 206 of semiconductor material, a layer 207 of dielectric material may be formed for the passivation of the surface of the layer 206, as described above. In other embodiments, the layer 207 of dielectric material may be omitted, and a passivation of the surface of the layer 206 can be performed by means of a passivating solution. In the layer 206 of semiconductor material and the layer 207 of dielectric material, trenches 404, 405 (FIG. 4*b*) can be formed for isolation. To this end, a mask 401 is formed over the semiconductor structure 117. In some embodiments, the mask 401 may comprise a photoresist, and can be formed by means of techniques of photolithography well known to persons skilled in the art. In other embodiments, the mask 401 can comprise a hard mask. Techniques for the formation of hard masks are well known to persons skilled in the art of semiconductor processing. The mask 401 comprises openings 402, 403 which are provided at locations where the trenches 404, 405 are to be formed. Portions 420, 421, 423 between the openings 402, 403 are covered by the mask 401.

Figure 4B:
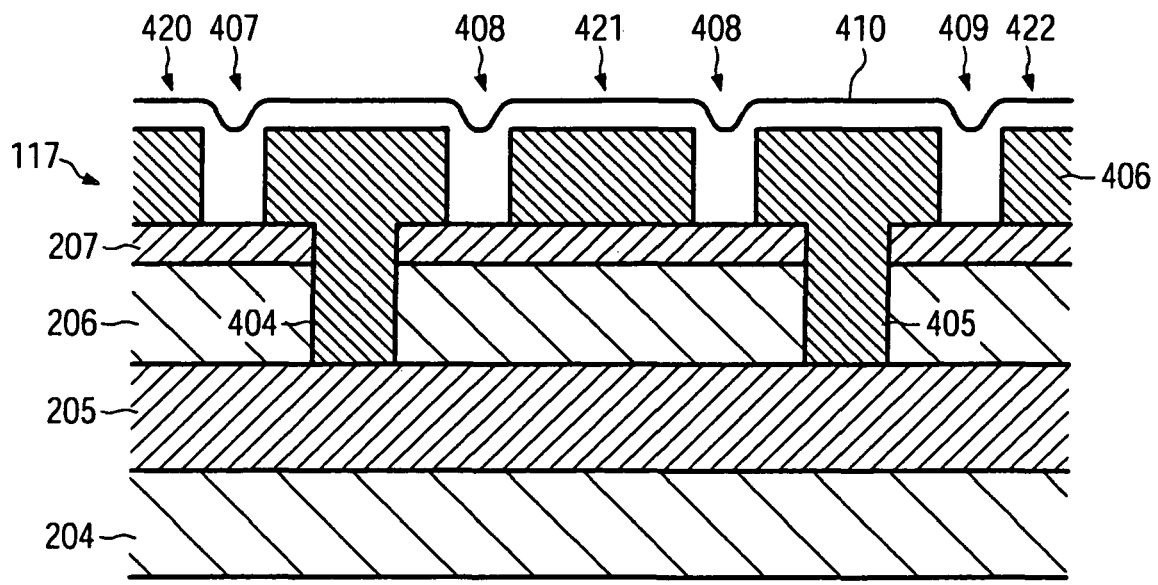

FIG. 4*b* shows a schematic cross-sectional view of the semiconductor structure 117 in a later stage of the method according to the present invention.

After the formation of the mask 401, an etching process can be performed. In the etching process, the semiconductor structure 117 may first be exposed to an etchant adapted to selectively remove the dielectric material of the layer 207, leaving the materials of the mask 401 and the layer 206 of semiconductor material substantially intact. Thus, openings may be formed in the layer 207 below the openings 402, 403 of the mask 401. Thereafter, the semiconductor structure 117 may be exposed to an etchant adapted to selectively remove the semiconductor material of the layer 206, leaving the materials of the mask 401 and the layers 207, 205 substantially intact. The portions 420, 421, 422 of the semiconductor structure 117 between the openings 402, 403 are protected from being affected by the etchant by the mask 401. Hence, trenches 404, 405 extending through the layers 206, 207 can be formed. After the formation of the trenches 404, 405, the mask 401 can be removed by means of a resist strip process well known to persons skilled in the art.

Portions of the layer 206 of semiconductor material in portions 420, 421, 422 of the semiconductor structure 401 can be separated from each other by the trenches, such that the trenches 402, 403 provide electrical insulation between the individual portions of the layer 206. Thus, the trenches 402, 403 form an insulation structure. In some embodiments, the trenches 404, 405 may be filled with an electrically insulating material such as, for example, silicon dioxide and/or silicon nitride. This can be done by means of techniques of oxidation, nitridation and/or deposition well known to persons skilled in the art.

Alternatively, after the removal of the optional layer 207, the layer 206 can be oxidized, nitrated or otherwise transformed into an insulating material rather than being etched.

In some embodiments, trenches 402, 403 and further trenches (not shown) may be formed in the layer 206 of semiconductor material and the layer 207 of dielectric material, wherein the trenches are arranged in a grid pattern. A first subset of the trenches may, in some of these embodiments, be arranged in a direction substantially perpendicular to a direction of a second subset of the trenches. Thus, a square or rectangular lattice of portions of the layer 206 of semiconductor material which are electrically insulated from each other may be formed.

After the formation of the trenches 404, 405, a plurality of electrically conductive contact structures 411, 412, 413 (FIG. 4c) may be formed over the semiconductor structure 117. To this end, a mask 406 may be formed over the semiconductor structure 117. The mask 406 may comprise a photoresist and can be formed by means of techniques of photolithography well known to persons skilled in the art.

The mask 406 may comprise openings 407, 408, 409 provided at locations at which the contact structures 411, 412, 413 are to be formed. A shape of the openings 407, 408, 409 may correspond to the desired shape of the contact structures 411, 412, 413. At the bottom of the openings 407, 408, 409, the layer 207 of dielectric material may be exposed or removed.

After the formation of the mask 406, a layer 410 of an electrically conductive material can be formed over the semiconductor structure 117. The layer 410 of electrically conductive material may cover the mask 410 and portions of the layer 207 of dielectric material exposed at the bottom of the openings 407, 408, 409.

Figure 4C:
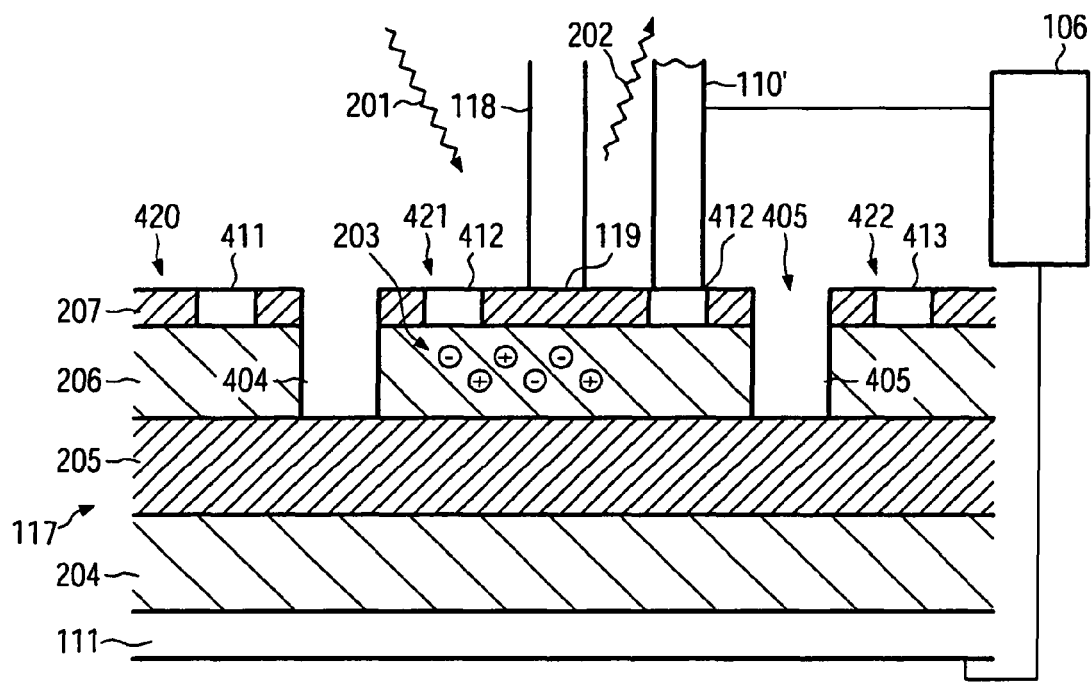

FIG. 4c shows a schematic cross-sectional view of the semiconductor structure 117 in a later stage of the method according to the present invention.

After the formation of the layer 410 of electrically conductive material, a resist strip process may be performed. In the resist strip process, the semiconductor structure 117 is exposed to a resist strip solution adapted to selectively remove the material of the mask 406, leaving other materials of the semiconductor structure 117 substantially intact. Hence, the mask 406 may be removed. Portions of the layer 410 of electrically conductive material on the mask 406 may be removed together with the mask, whereas portions of the layer 410 of electrically conductive material formed on the layer 207 of dielectric material may remain on the semiconductor structure 117, forming a plurality of contact structures 411, 412, 413.

In some embodiments, the layer 410 of electrically conductive material may comprise a metal.

In some of these embodiments, the layer 410 can comprise a first sublayer comprising at least one of Al, Er, Gd, Nd, Ti and Y, and a second sublayer comprising at least one of Ag, Al, Au, Cr, Cu, Mg, Ni and Pt, wherein the first sublayer is formed on the layer 207 of dielectric material and the second sublayer is formed on the first sublayer. The first sublayer and the second sublayer can be formed by means of deposition processes well known to persons skilled in the art. After the resist strip process, an annealing process may be performed. In the annealing process, the dielectric material exposed at the bottom of the openings 407, 408, 409 may be consumed by a chemical reaction with the material of the first sublayer, such that the layer 410 is electrically connected to the layer 206 of semiconductor material.

In other embodiments, an etching process may be performed after the formation of the mask 406 and before the formation of the layer 410 of electrically conductive material. In the etching process, the semiconductor structure 117 may be exposed to an etchant adapted to selectively remove the dielectric material of the layer 207, leaving the material of the mask 406 and the layer 206 of semiconductor material substantially intact. Hence, portions of the layer 207 of dielectric material at the bottom of the openings 407, 408, 409 may selectively be removed. Hence, the layer 410 may contact the layer 206, providing an electrical connection to the layer 206.

In embodiments of the present invention, one contact structure may be formed in each of the portions 420, 421, 422 of the semiconductor structure 117. For example, the contact structure 411 can be provided in portion 420, the contact structure 412 can be provided in portion 421 and the contact structure 413 can be provided in portion 422. The contact structures 411, 412, 413 may have substantially equal shapes.

Figures 5A, 5B:
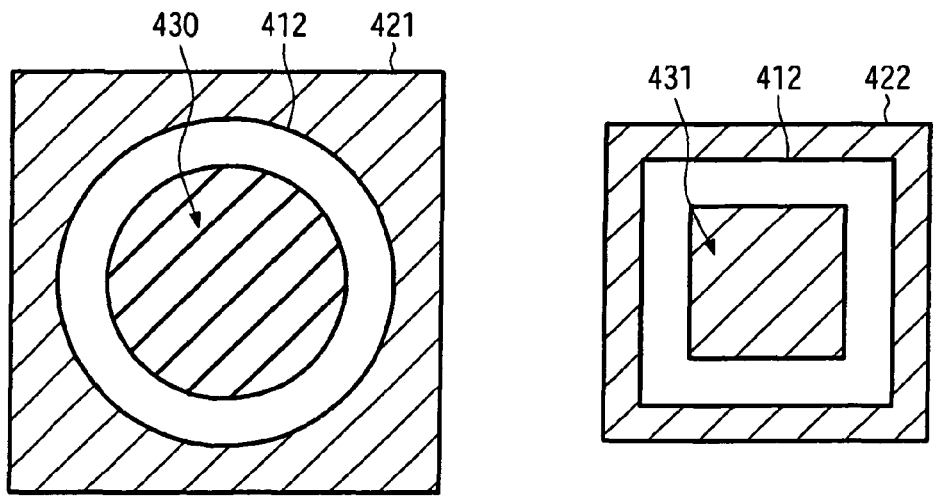
FIGS. 5a and 5b show schematic top view of contact structures formed on a semiconductor structures during a method of measuring a lifetime of charge carriers according to an embodiment of the present invention.

In one embodiment, each of the contact structures 411, 412, 413 may have a substantially ring-shaped configuration, as shown schematically for the contact structure 412 in the top view of FIG. 5a. In another embodiment, each of the contact structures 411, 412, 413 may have substantially a rectangular or square shape, as shown schematically for the contact structure 412 in FIG. 5b.

After the formation of the contact structures 411, 412, 413, a measurement run can be performed. To this end, the semiconductor structure 117 may be placed on the semiconductor structure holder 111 of the apparatus 100 described above with reference to FIG. 1 such that the semiconductor structure holder 111 provides an electrical connection to the substrate 204. Thereafter, the surface of the semiconductor structure 117 may be passivated by electrically charging the surface of the layer 207 of dielectric material by means of the corona wire 113, as described above with reference to FIGS. 1 and 2, and a bias voltage may be applied between one of the contact structures 411, 412, 413, for example the contact structure 412, and the semiconductor structure holder 111.

In some embodiments, the bias voltage can be applied by touching the contact structure 412 by means of an electrode 110' adapted to provide an electrical connection to the contact structure 412. In one embodiment, the electrode 110' can comprise an electrically conductive stylus connected to the power source 106. The electrode 110' may be attached to the measuring probe 108 instead of the electrode 110 described above, or may be provided in addition to the electrode 110. In order to touch the contact structure 412 by the electrode 110', the semiconductor structure holder 111 may be moved relative to the measuring probe 108 in the x-direction and the y-direction until the electrode 110' is located above the contact structure 412. Thereafter, the semiconductor structure holder 111 may be moved upward, or the measuring probe 108 may be lowered until the electrode provides an electrical connection to the contact structure 412.

In such a case, with a circular, rectangular or square shaped electrode, the bias voltage is controlled on the whole area defined by the contact structure. It is therefore possible to measure everywhere in this area without having the measuring probe adjacent or in the vicinity of the electrode.

Thereafter, the semiconductor structure 117 may be irradiated with microwave radiation 201 and electromagnetic radiation 118 may be directed towards the measuring position 119. Since both the electrode 110' and the light source 109 are attached to the measuring probe 108, the measuring position and the contact structure 412 may have a predetermined spatial relationship relative to each other if the electrode 110' touches the contact structure 412. In embodiments wherein the contact structure 412 has a substantially ring-shaped configuration as shown in FIG. 5a, or a substantially square-shaped configuration as shown in FIG. 5b, the spatial relationship between the measuring position 119 and the contact structure 412 may be such that a portion of the layer 206 of semiconductor material exposed at a central opening 430 or 431, respectively, of the contact structure 412 is irradiated with the electromagnetic radiation 118.

Due to the irradiation with the electromagnetic radiation 118, electron-hole pairs 203 can be created in the layer 206 of semiconductor material. A lifetime of the electrons and/or holes may then be determined by measuring the intensity of microwave radiation 202 reflected from the semiconductor structure 117 after directing the electromagnetic radiation 118 towards the semiconductor structure 117, as described above with reference to FIGS. 1 and 2.

Thereafter, a next measurement run may be performed. In the next measurement run, the semiconductor structure 117 is moved relative to the measurement probe 108 until the measurement position 119 and another one of the contact structures 411, 412, 413, for example the contact structure 413, are provided at the predetermined spatial relationship to each other, and an electric contact between the electrode 110' and the contact structure 413 is established by touching the contact structure 413 with the electrode 110'. Thus, spatially resolved measurements of the lifetime of charge carriers in the semiconductor structure 117 may be obtained. The trenches 404, 405 provide electrical insulation between the regions 420, 421, 422 of the semiconductor structure 117 such that a measurement performed in one the regions 420, 421 422 may substantially not be affected by the state of other ones of the regions 420, 421, 422.

In further embodiments of the present invention, trenches 404, 405 may be formed to provide electrical insulation between the portions 420, 421, 422, and the formation of the contact structures 411, 412, 413 may be omitted. In such embodiments, the bias voltage may be applied by means of one or more electrodes comprising needles, similar to the electrodes 110, 312-321, 331-338 described above with reference to FIGS. 1, 2, 3a, 3b and 3c.

What is claimed is:

1. An apparatus for measuring a lifetime of charge carriers comprising:
    a measuring probe comprising means for directing ultraviolet radiation to a measuring position, said measuring probe further comprising at least one electrode provided at a predetermined spatial relationship to said measuring position, wherein said at least one electrode comprises a needle adapted to puncture said semiconductor structure or is adapted to provide an electrical connection to an electrically conductive contact structure formed on said semiconductor structure and wherein said measuring probe is adapted to maintain said predetermined spatial relationship between said at least one electrode and said measuring position;
    a microwave source adapted to direct microwave radiation to said measuring position;
    a microwave detector adapted to measure an alteration of an intensity of microwave radiation reflected at said measuring position in response to said ultraviolet radiation;
    a semiconductor structure holder adapted to receive a semiconductor structure and to provide an electric contact to a portion of said semiconductor structure;
    a means for moving said semiconductor structure holder relative to said measuring probe for positioning at least one portion of said semiconductor structure at said measuring position; and
    a power source adapted to apply a bias voltage between said semiconductor structure holder and said electrode.

2. The apparatus in claim 1, wherein said at least one electrode comprises one electrode provided adjacent to said measuring position.

3. The apparatus in claim 1, wherein said at least one electrode comprises a first electrode and a second electrode, and wherein said measuring position is located between said first electrode and said second electrode.

4. The apparatus in claim 3, wherein said at least one electrode comprises a plurality of first electrodes arranged along a first line and a plurality of second electrodes arranged along a second line, wherein said second line is parallel to said first line and wherein said measuring position is located between said first line and said second line.

5. The apparatus in claim 1, wherein said at least one electrode comprises a plurality of electrodes circularly surrounding said measuring position.

6. The apparatus in claim 1, further comprising a corona wire and means for applying a voltage between said corona wire and said semiconductor structure holder.

7. The apparatus in claim 6, further comprising means for moving said corona wire relative to said semiconductor structure holder.

8. The apparatus in claim 1, further comprising a passivation solution supply adapted to supply a passivation solution to said semiconductor structure.

9. The apparatus in claim 1, wherein said means for directing ultraviolet radiation to said measuring position comprise a pulsed ultraviolet laser.

10. A method of measuring a lifetime of charge carriers comprising:
    providing a semiconductor structure comprising a substrate, a layer of an insulating material formed over said substrate and a layer of a semiconductor material formed over said layer of insulating material;
    performing a measurement run comprising:
        irradiating said semiconductor structure with microwave radiation;
        directing ultraviolet radiation to a portion of said semiconductor structure located at a measuring position;
        selectively applying a bias voltage between said substrate and at least one contact point having a predetermined spatial relationship to said measuring position; and
        measuring an alteration of an intensity of microwave radiation reflected from said semiconductor structure in response to said ultraviolet radiation;
    said method of measuring a lifetime of charge carriers further comprising:
        moving said semiconductor structure relative to said measuring position; and repeating said measurement run at least once, wherein said predetermined spatia relationship between said measuring position and said at least one contact point is maintained.

11. The method of claim 10, wherein providing said semiconductor structure comprises passivating a surface of said layer of semiconductor material.

12. The method of claim 11, wherein said passivation of said surface of said layer of semiconductor material comprises supplying a passivation solution to said surface of said layer of semiconductor material.

13. The method of claim 12, wherein said passivation solution comprises at least one of diluted hydrogen fluoride and a solution of a halogen in a solvent.

14. The method of measuring a lifetime of charge carriers as in claim 13, wherein said passivation of said surface of said layer of semiconductor material comprises forming a layer of a dielectric material over said layer of semiconductor material.

15. The method of claim 14, wherein a corona discharge is applied to a surface of said layer of dielectric material to electronically charge said surface of said layer of dielectric material.

16. The method of claim 15, wherein said application of said corona discharge is performed before each measurement run.

17. The method of claim 14, further comprising performing an annealing to cure an interface between the layer of semiconductor material and the layer of dielectric material.

18. The method of claim 10, wherein said provision of said semiconductor structure further comprises forming a plurality of electronically conductive contract structures, over said layer of semiconductor material, wherein, in each measurement run, said bias voltage is applied between said substrate and one of said plurality of contact structures, and said ultraviolet radiation is directed to a portion of said semiconductor structure having said predetermined spatial relationship to said one of said plurality of contact structures.

19. The method of measuring a lifetime of charge carriers as in claim 18, wherein each of said plurality of contact structures has one of a ring-shaped configuration, a square-shaped configuration and a rectangular configuration and comprises a central opening.

20. The method of claim 10, wherein said application of said bias voltage between said substrate and said at least one contact point comprises puncturing said semiconductor structure by means of at least one electrode.

21. The method of claim 10, further comprising forming an insulation structure providing electrical insulation between a plurality of portions of said semiconductor structure, wherein, in each measurement run, said ultraviolet radiation is directed to one of said plurality of portions of said semiconductor structure and said at least one contact point is provided in said one of said plurality of portions of said semiconductor structure.

22. The method of claim 21, wherein said insulation structure comprises at least one of trench, an oxidized region and a nitrided region.

23. The method of claim 21, wherein said formation of said insulation structure comprises at least one of forming a shallow trench isolation, forming a mesa and performing a local oxidation of said layer of semiconductor material.

* * * * *